United States Patent [19]

Marconi

[11] 4,323,161
[45] Apr. 6, 1982

[54] PRINTED CIRCUIT CARD RETAINER AND RACK ASSEMBLY

[76] Inventor: Joseph Marconi, 428 S. Jensen Rd., Vestal, N.Y. 13850

[21] Appl. No.: 972,242

[22] Filed: Dec. 22, 1978

[51] Int. Cl.³ .............................................. H02B 1/02
[52] U.S. Cl. ........................................ 211/41; 361/415
[58] Field of Search ........................... 211/41, 40, 162; 361/415

[56] References Cited

U.S. PATENT DOCUMENTS

| | | | |
|---|---|---|---|
| 3,219,182 | 11/1965 | Cornwell | 211/41 X |
| 3,563,391 | 2/1971 | Weltha et al. | 211/41 |
| 3,664,510 | 5/1972 | Kerschbaum | 211/41 |
| 3,669,279 | 6/1972 | Burgard et al. | 211/41 X |
| 3,696,936 | 10/1972 | Straccia et al. | 211/41 |
| 3,714,513 | 1/1973 | Marconi | 211/41 X |
| 3,878,438 | 4/1975 | Weisman | 211/41 X |
| 4,007,403 | 2/1977 | Piege | 211/41 X |
| 4,022,326 | 5/1977 | Marconi | 211/41 |

Primary Examiner—Roy D. Frazier
Assistant Examiner—Robert W. Gibson, Jr.
Attorney, Agent, or Firm—Jones, Tullar & Cooper

[57] ABSTRACT

A printed circuit card retainer and rack assembly is described. The retainers comprise resilient arcuate channel members of U-shaped cross section having a flared central wall portion permitting vertical alignment of cards of diverse thickness. The retaining force exerted by the resiliency and deformation of the members is in the vertical direction parallel to the face of the card. The flared portion lends additional stiffness to each member in the horizontal direction.

1 Claim, 3 Drawing Figures

PRINTED CIRCUIT CARD RETAINER AND RACK ASSEMBLY

FIELD OF THE INVENTION

This invention relates to retaining guides for printed circuit cards which are mounted on racks which, in the form of a cage, accommodate a plurality of cards in spaced relationship.

In the present state of electronic technology, components of a circuit are mounted on flat plates of an insulated material which have a conductive backing. The latter is cut out or etched to present conductive paths of predetermined configuration, whereby the various components are interconnected in accordance with a schematic circuit. Such plates are generally known as printed circuit cards or boards.

The circuits presented by a number of cards are generally interconnected by suitable terminal sockets of the plug-in type into which the connectors of the cards may easily be inserted. Thus the purpose of the rack is to provide a frame or cage for retaining guides which accommodate the cards and to serve as a support for the terminal sockets. The retainers for the cards are in most cases of channel-type construction for slidably supporting the cards.

It is manifestly of great advantage if the retainers allow easy insertion and removal of the cards and, at the same time, provide a firm hold.

DESCRIPTION OF THE PRIOR ART

The retainers of printed circuit cards generally consist of narrow, linear channel-type structures. While such channel members may provide a firm hold on the cards, the problem arises as to what extent such hold should be maintained. Manifestly, if the lateral hold against the card surface is strong, it prevents easy sliding of the card in and out of the channel member and, vice versa, if easy sliding is to be maintained, and this is a desirable requirement, then the hold on the card will not be sufficiently reliable.

Attempts have been made to utilize retainers made of plastic material which improves the condition of slidability. However, plastic members, generally molded, are by no means sturdy and often, upon insertion of a panel, breakage occurs. This, of course, requires disassembly of the rack in order to install a new retainer. Not only is this a tedious procedure, but it entails the shutting down of the entire assembly as far as its electrical function is concerned. In addition, grip-type plastic retainers must be wide at the bottom in order to accommodate the resilient gripping members which engage the card. This requires much wider channel members which, of course, limits the number of cards one may place in the rack. Moreover, such retainers restrict the air flow which is important for adequate cooling of the components.

Retainers for printed circuit cards in such form as to be strong, yet resilient, and to provide a holding force allowing easy removal, yet firm support, has been the object of various patents of the prior art. The most common form utilizes rectilinear channel members having a gripping action directed towards the side of the cards. These are exemplified by U.S. Pat. Nos. 3,349,924; 3,549,950; and 3,563,391.

Edge contact with some lateral guidance is shown in U.S. Pat. Nos. 3,696,936 and 3,465,891. The edge contacts are generally in the form of spring members which are depressed upon insertion of the card. This dual hold requires careful tolerances of pressure in order to avoid overclamping of the cards.

A unique approach is represented by applicant's U.S. Pat. No. 3,714,513 where an arcuate channel member is rectilinearly distorted by the insertion of a card, thus producing a firm hold with ease of insertion or removal.

Another patent of applicant—U.S. Pat. No. 4,022,326—describes a retaining guide which has an undulating configuration, the retentive force being exerted transverse to the wall of the card.

SUMMARY OF THE INVENTION

It is the primary object of this invention to provide retaining members for printed circuit cards adapted to be mounted on a rack which, while of the sliding type, exert a force solely on the edge of the card and thereby allow easy removal or insertion of such cards.

It is a distinct feature of the invention that the retaining member, while flexible, has a rigid reinforced portion at one point which lends greater stiffness in the direction horizontal to the position of the member.

It is a particular advantage of the invention that the alteration of the side wall that results in the reinforced portion, increases the flexibility in the vertical direction.

Other objects, features and advantages will be apparent from the following description of the invention, defined in particularity in the appended claims, and taken in connection with the accompanying drawing, in which:

Figure 1:
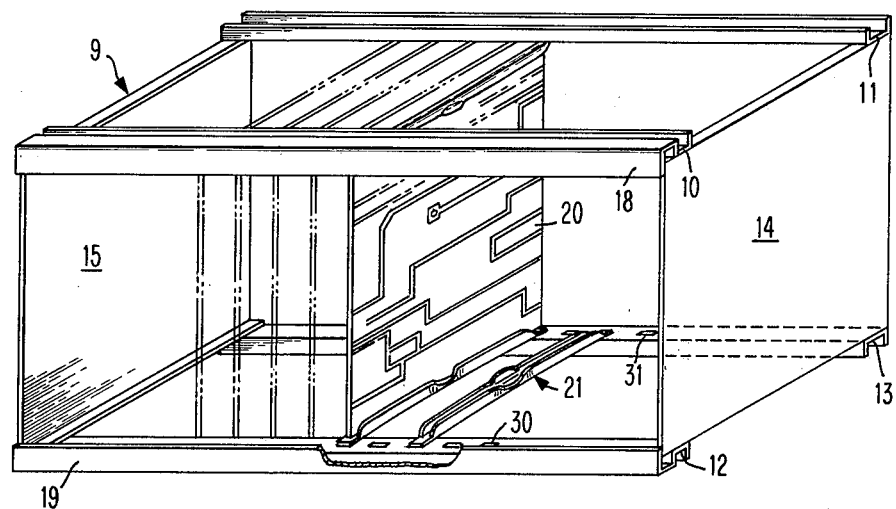
FIG. 1 is a perspective view of a printed circuit card rack constructed in accordance with the invention.

Referring to the figures, it is seen in FIG. 1 that the rack 9 presents a frame of oblong configuration, consisting of parallel support members 10, 11, 12 and 13 which are joined to end plates 14 and 15. Support members 10 and 12 have inwardly-extending lips 18 and 19, respectively, the purpose of which, as will be understood later, is to act as an abutting wall for the circuit board 20. Consequently, the illustration in FIG. 1 is a back view of the rack 9. The latter accommodates a plurality of card retainers 21 in spaced relationship. For the sake of simplifying the drawing, only two retainers are shown in detail. Any number of these may be used, depending upon the size of the rack 9. The retainers are placed between support members 10 and 11, and 12 and 13, respectively. The distance between the placement of retainers 21 depends upon the component elements of circuit board 20. Sufficient space must be provided so that each circuit board 20 may be easily inserted between oppositely placed retainers.

Inasmuch as all retainers are of like construction, a single reference character 21 is chosen to represent them, whether placed on the top of the rack 9 or on the bottom thereof.

Figure 2:
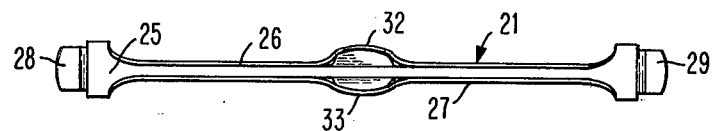
FIG. 2 is a top view, in perspective, of a card retaining member.
Figure 3:
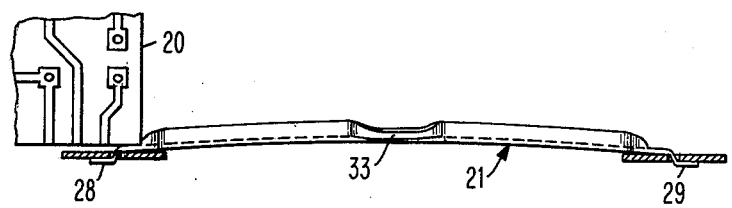
FIG. 3 is a side elevational view of the retaining member, illustrating its placement in the cutout provided in support members of the cage and also showing a portion of the circuit board about to be inserted.

Referring to FIG. 2, it is seen that the retainer 21 comprises essentially a channel member having a flat bottom portion 25 and side walls 26 and 27 so that the structure forms a U-shaped trough. The bottom portion 25 extends into lips 28 and 29 which are turned down in order to be inserted into appropriate slots 30 and 31 provided in the support members 10 and 11 or 12 and 13, respectively. In this manner, the retainers 21 are held in place, although, as will be seen, allowing some movement thereof in the axial direction.

The retainers 21 are of arcuate shape and may be fabricated from resilient materials such as, for example, spring steel or beryllium copper.

It has been found that flexibility of a channel member is not the most desirable asset. The reason is that lateral pressure may force the card out of proper position. The channel member should be resilient but, at the same time, have a certain lateral stiffness. This is achieved in accordance with the present invention by flaring out a portion of the side walls, resulting in a saddle-shaped formation in the center of the channel member.

By this simple expedient, the channel member is reinforced against pressure exerted in the horizontal direction while the elasticity in the vertical direction is increased. This, in fact, increases the flexibility.

The alteration of the side walls, by flaring out a portion thereof, results in a saddle formation by virtue of the fact that a die and a punch is used to effect the alteration. By this means, the retainer 21 becomes more flexible and permits the use of relatively shorter channel members.

No bouncing is experienced; consequently, the contact of the card with the required sockets is more reliable. At the same time, removal of a card is easier, inasmuch as the flexibility in the vertical direction is increased.

This invention in its broader aspects is not limited to the specific embodiment herein shown and described but changes may be made within the scope of the accompanying claims without departing from the principles of the invention and without sacrificing its chief advantages.

What is claimed is:

1. A retaining guide for a printed circuit card, said retaining guide extending horizontally between, and being supported by spaced parallel support members of a generally oblong frame, said retaining guide comprising:

a resilient arcuate channel member having a flat bottom and upstanding thin side walls, ends of said bottom extending as lips which engage said parallel support members to support said retaining guide in said frame while allowing said retaining guide to flex in the vertical direction; and a saddle shaped flared out alteration of said channel member generally at the center of said channel member, said saddle shaped flared out portion of said channel member decreasing the height of said side walls and correspondingly increasing the width of said bottom to thereby increase the stiffness of said retaining guide against bending in the horizontal direction while increasing the flexibility of said retaining guide in the vertical direction.

* * * * *